United States Patent
Min et al.

(10) Patent No.: US 7,795,702 B2
(45) Date of Patent: Sep. 14, 2010

(54) MICROELECTRONIC ASSEMBLIES WITH IMPROVED ISOLATION VOLTAGE PERFORMANCE

(75) Inventors: Won Gi Min, Chandler, AZ (US); Veronique C. Macary, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/717,522

(22) Filed: Mar. 4, 2010

(65) Prior Publication Data
US 2010/0164056 A1    Jul. 1, 2010

Related U.S. Application Data

(62) Division of application No. 11/680,316, filed on Feb. 28, 2007, now Pat. No. 7,700,405.

(51) Int. Cl.
*H01L 29/00* (2006.01)
(52) U.S. Cl. .............................. 257/544; 257/E21.001; 257/E29.001
(58) Field of Classification Search ............ 257/544, 257/E21.001, E21.009
See application file for complete search history.

(56) References Cited

U.S. PATENT DOCUMENTS

| | | | |
|---|---|---|---|
| 3,878,551 A | 4/1975 | Callahan, Jr. | |
| 4,466,011 A | 8/1984 | Van Zanten | |
| 4,819,052 A | 4/1989 | Hutter | |
| 4,980,747 A | 12/1990 | Hutter et al. | |
| 5,045,904 A | 9/1991 | Kobayashi et al. | |
| 5,072,287 A | 12/1991 | Nakagawa et al. | |
| 5,394,007 A | 2/1995 | Reuss et al. | |
| 5,605,851 A | 2/1997 | Palmieri et al. | |
| 5,670,821 A | 9/1997 | Bowers | |

FOREIGN PATENT DOCUMENTS

JP        58186947        3/2010

*Primary Examiner*—David S Blum
(74) *Attorney, Agent, or Firm*—Ingrassia, Fisher & Lorenz, P.C.

(57) ABSTRACT

Embodiments of microelectronic assemblies are provided. First and second semiconductor devices are formed over a substrate having a first dopant type at a first concentration. First and second buried regions having a second dopant type are formed respectively below the first and second semiconductor devices with a gap therebetween. At least one well region is formed over the substrate and between the first and second semiconductor devices. A barrier region having the first dopant type at a second concentration is formed between and adjacent to the first and second buried regions such that at least a portion of the barrier region extends a depth from the first and second semiconductor devices that is greater or equal to the depth of the buried regions.

20 Claims, 6 Drawing Sheets

MICROELECTRONIC ASSEMBLIES WITH IMPROVED ISOLATION VOLTAGE PERFORMANCE

RELATED APPLICATION

This application is a divisional of U.S. patent application Ser. No. 11/680,316.

TECHNICAL FIELD

Embodiments of the present invention generally relate to microelectronic assemblies, and more particularly relate to microelectronic assemblies with improved isolation voltage performance.

BACKGROUND

Integrated circuits are formed on semiconductor substrates (or wafers). The wafers are then sawn into microelectronic die (or "dice"), or semiconductor chips, with each die carrying a respective integrated circuit. Each semiconductor chip is connected to a package or carrier substrate using either wire bonding or "flip-chip" connections. The packaged chip is then typically mounted to a circuit board, or motherboard, before being installed in a system, such as an electronic or a computing system.

In power integrated circuits, several semiconductor devices with voltage handling capability ranging from low to very high are integrated together. The devices with different characteristics and performance ratings need to be isolated from each other in order to prevent any "cross-talk" leading to malfunction in circuit operation. Thus, device-to-device isolation voltage capability is an important parameter in power integrated circuits.

One of the methods that has been attempted to improve isolation voltage, or voltage handling capability, involves the formation of "isolation rings" around the individual semiconductor devices. Typically, isolation rings utilize a "buried" layer formed below the semiconductor device and a first "well" (or wells) within the substrate that surrounds the device, both including semiconductor material of a dopant type that is opposite to that of the substrate. A second (or isolation well), of the same dopant type as the substrate, is also often formed between the first wells. However, the isolation well is typically formed after the formation of the epitaxial layer over the substrate, and as a result, can not be formed to a depth sufficient to maximize isolation voltage performance Accordingly, it is desirable to provide a microelectronic assembly with an improved voltage handling capability between individual semiconductor devices. In addition, it is desirable to provide such an assembly with minimal size and manufacturing costs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The various embodiments will hereinafter be described in conjunction with the following drawings, wherein like numerals denote like elements.

DETAILED DESCRIPTION

The following detailed description is merely exemplary in nature and is not intended to limit the application and uses of the various embodiments. Furthermore, there is no intention to be bound by any expressed or implied theory presented in the preceding technical field, background, and brief summary, or the following detailed description. It should also be noted that FIGS. 1-13 are merely illustrative and may not be drawn to scale.

FIG. 1 to FIG. 13 illustrate a microelectronic assembly and a method for forming a microelectronic assembly according to various embodiments of the present invention. Buried layers are formed in a semiconductor substrate having a first dopant type at a first concentration. The buried layers have a second dopant type and are spaced apart such that a gap lies between. A barrier region is formed within the gap and adjacent to the buried layers. The barrier region has the first dopant type at a second concentration that is higher than the first concentration. An epitaxial layer is formed over the semiconductor substrate, in one embodiment, after the formation of the first and second buried layers and the barrier region. Well regions, which may have the second dopant type, are formed within the epitaxial layer.

Semiconductor devices are formed over the epitaxial layer above the buried layers. The barrier regions extend a depth below the semiconductor devices, or an upper surface of the epitaxial layer, that is greater than or equal to a depth of the buried layers. As a result, the voltage between the semiconductor devices may be increased, which may allow the operating voltages of the devices to be increased and/or the distance between individual devices may be decreased while maintaining the same operating voltages. As will be described in greater detail below, the barrier regions may be formed without an additional processing step (i.e., photo-resist, lithography, etc.), which minimizes manufacturing time and costs.

Figure 1:
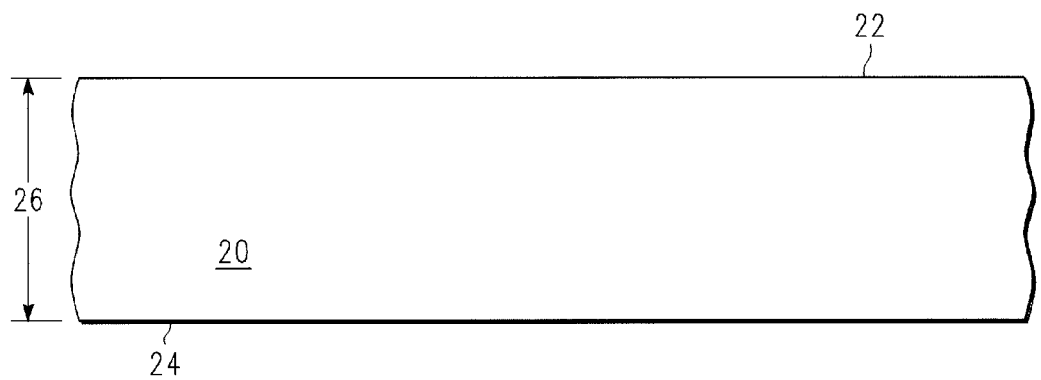
FIG. 1 is a cross-sectional side view of a semiconductor substrate according to an embodiment of the present invention.

Referring to FIG. 1, there is illustrated a semiconductor substrate 20 comprising a semiconductor material, such as gallium arsenide (GaAs), gallium nitride (GaN), or silicon (Si). The substrate 20 has an upper surface 22, a lower surface 24, and a thickness 26, for example, between approximately 300 and 1000 micrometers (μm). The semiconductor material of the substrate 20 may be of a first conductivity type, or doped with a first dopant type, as is commonly understood in the art. In the example illustrated in FIG. 1, the substrate 20 is a "P-type" semiconductor substrate and is doped with boron (B) to a concentration of, for example, approximately $1.0 \times 10^{15}$ atoms per $cm^3$.

Although only a portion of the semiconductor substrate 20 is illustrated, it should be understood that the substrate 20 may be a semiconductor wafer with a diameter of, for example, approximately 150, 200, or 300 millimeters. Additionally, although not specifically illustrated, the substrate 20 may be divided into multiple dies, or "dice," as commonly understood in the art. Furthermore, although the following process steps may be shown as being performed on only a small portion of the substrate 20, it should be understood that each of the steps may be performed on substantially the entire substrate 20, or multiple dice, simultaneously. Furthermore, although not shown, it should be understood that the processing steps described below may be facilitated by the deposition and removal of multiple additional processing layers, such as photoresist layers, as is commonly understood.

Figure 2:
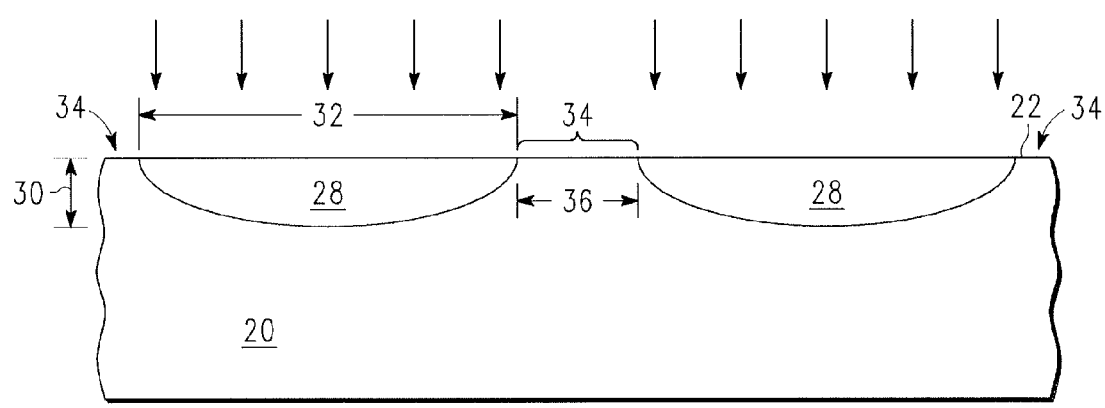
FIG. 2 is a cross-sectional side view of the substrate of FIG. 1 undergoing an implantation process to form buried layers in the substrate according to an embodiment of the present invention.

As illustrated in FIG. 2, a plurality of buried layers 28 (or regions) are first formed in the upper surface 22 of the substrate 20. In one embodiment, the buried layers 28 are formed using ion implantation and have a thickness 30, or depth below the upper surface 22, of, for example, between approximately 1 and 2 μm and a width 32 of, for example, between 4 and 5 μm. As shown, the buried layers 28 are spaced apart such that a gap 34 lays therebetween with a width 36 of, for example, between 1 and 3 μm. The ion implantation process changes the semiconductor material of the substrate 20 within the buried layers 28 to a second conductivity type (i.e., via a second dopant type), as is commonly understood. In one embodiment, the buried layers 28 includes "N-type" semiconductor material doped with a relatively high concentration of antimony (Sb) of approximately $1.0 \times 10^{19}$ atoms per $cm^3$.

Figure 3:
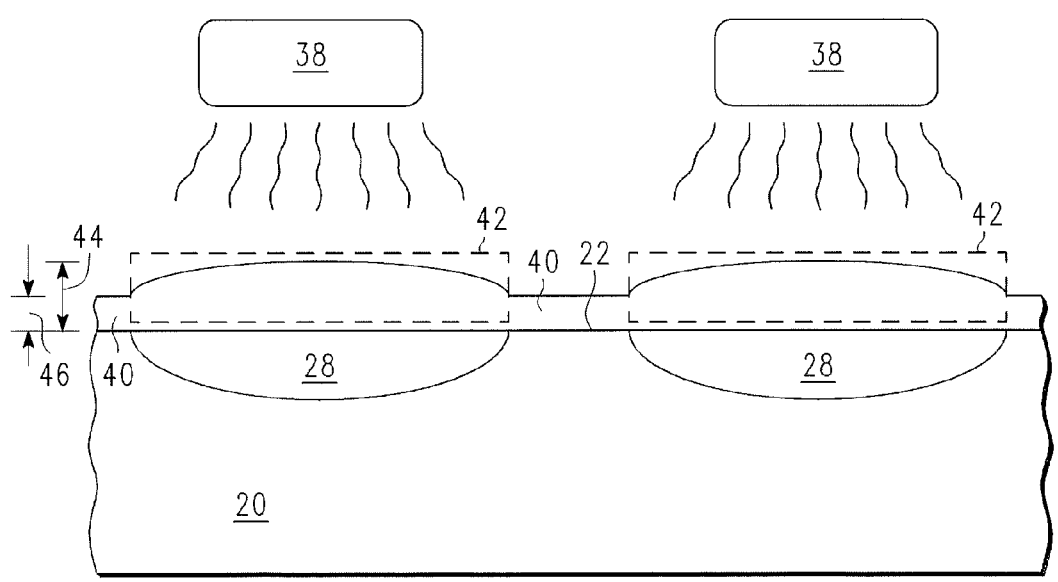
FIG. 3 is a cross-sectional side view of the substrate of FIG. 2 undergoing an annealing process according to an embodiment of the present invention.

As shown in FIG. 3, the substrate 20 then undergoes an annealing process using heating elements 38. During the annealing process, an oxide layer 40 is formed as a byproduct on the upper surface 22 of the substrate 20. As a result of the increased doping in the buried layers 28, portions 42 of the oxide layer 40 formed over the buried layers 28 have an increased thickness 44 of, for example, between 2000 and 4000 angstroms (Å), while the remainder of the oxide layer 40 has a thickness 46 of between 1000 and 2000 Å.

Figure 4:
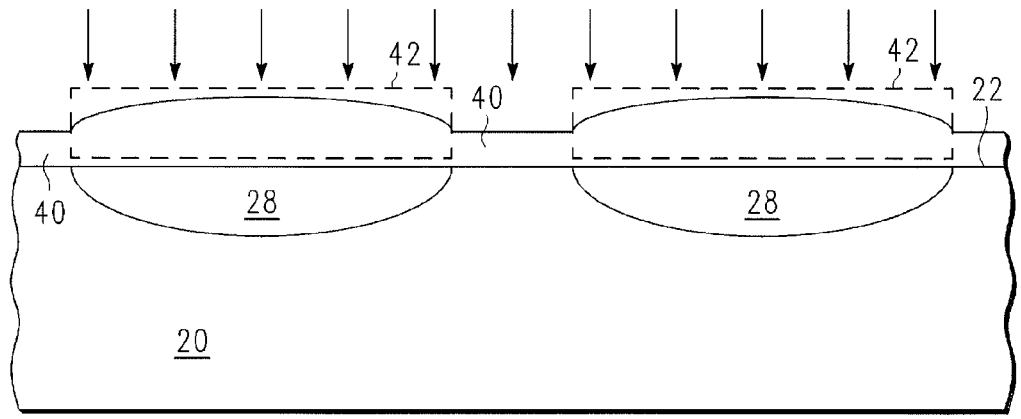
FIG. 4 is a cross-sectional side view of the substrate of FIG. 3 undergoing an implantation process to form barrier regions in the substrate according to an embodiment of the present invention.
Figure 5:
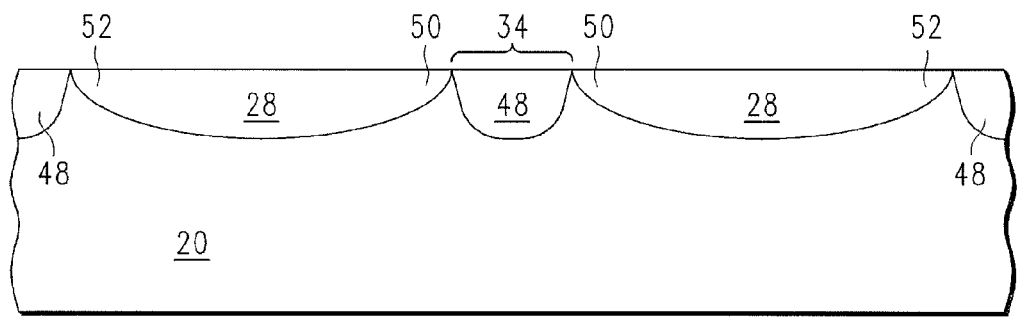
FIG. 5 is a cross-sectional side view of the substrate of FIG. 4 with the barrier regions formed therein according to an embodiment of the present invention.

Referring to FIGS. 4 and 5, the substrate 20 then undergoes an implantation process (e.g., ion implantation), which may be similar to the one shown in FIG. 2. Because of the increased thickness 44 (shown in FIG. 3) of the portions 42 of the oxide layer 40 above the buried layers 28, a reduced amount of the ions injected through the oxide layer 40 reach and penetrate the upper surface 22 of the substrate 20 at the buried layers 28. However, as shown in FIG. 5, which illustrates the substrate 20 after the oxide layer 40 has been removed, barrier regions (or isolation regions) 48 are formed within the gaps 34 between the buried layers 28 as a result of the ion implantation process. Referring specifically to FIG. 5, the barrier regions 48 may be understood to be formed between and adjacent to opposing first (or "inner" or adjacent) ends 50 of a particular pair of buried layers 28 which are adjacent to the gap 34, as opposed to second (or "outer" or opposing) ends 52 of the particular pair of buried layers 28. The barrier regions 48 may be of the first conductivity type (i.e., P-type) and doped with, for example, boron at a concentration of approximately $1.0 \times 10^{19}$ atoms per $cm^3$. It should be noted that the barrier regions 48 are, in one embodiment, of the same dopant type as the substrate 20, but at a higher concentration. Although not specifically illustrated, it should be understood that the ion implantation process shown in FIG. 4 may also cause ions to be implanted into the upper portions of the buried layers 28. However, because of the high concentration of the N-type dopants in the buried layers 28, as well as the increased thickness 44 of the oxide layer 40 (shown in FIG. 3) over the buried layers 28, this implantation may be negligible.

Figure 6:
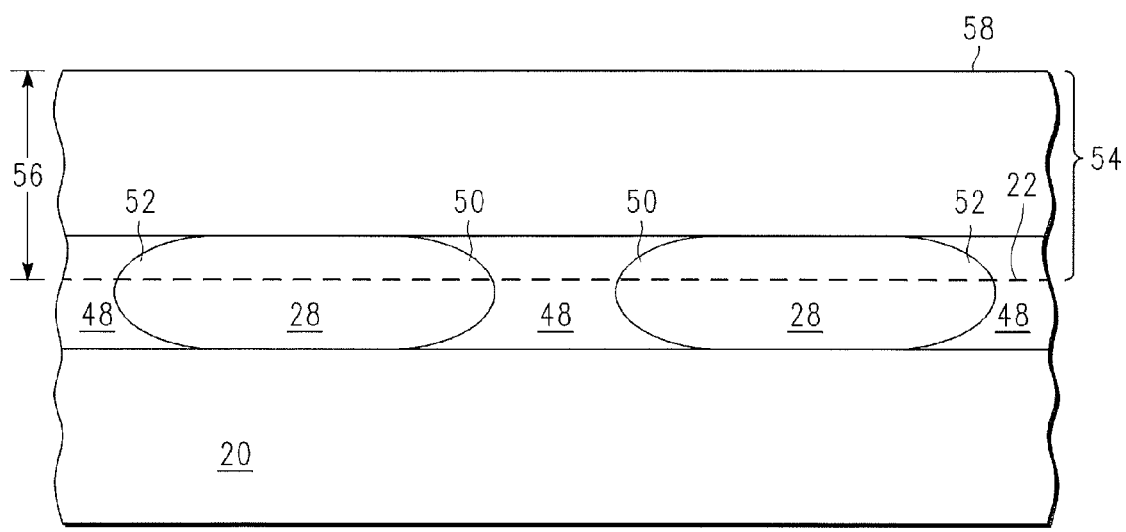
FIG. 6 is a cross-sectional side view of the substrate of FIG. 5 after an epitaxial layer formed thereon according to an embodiment of the present invention.

As illustrated in FIG. 6, an epitaxial layer 54 is then grown on (or over) the upper surface 22 of the substrate 20. The epitaxial layer 54 may have a thickness 56 of, for example, between 2 and 5 μm, and the semiconductor material of the epitaxial layer 54 may have the first conductivity type (i.e., P-type). In an embodiment of the present invention, the epitaxial layer 54 is doped with boron to a concentration of, for example, approximately $1.0 \times 10^{15}$ atoms per $cm^3$. The epitaxial layer 54 may also have an upper surface 58.

Still referring to FIG. 6, during the formation of the epitaxial layer 54, the buried layers 28 and the barrier regions 48 may diffuse into the epitaxial layer 54. The diffusion may cause the buried layers 28 and the barrier regions 48 to extend into the epitaxial layer 54 a distance of between approximately 0.2 and 0.5 μm, as measured from the upper surface 22 of the substrate 20. As shown, the barrier regions 48 may also diffuse around the ends 50 and 52 of the buried layers 28. As will be discussed in greater detail below, after the formation of the epitaxial layer 54 the buried layers 28 and the barrier regions 48 may extend, or occupy, substantially equal depths as measured from the upper surface 58 of the epitaxial layer 54. The diffusion may substantially complete the formation of the buried layers 28 and the barrier regions 48, which may at least be partially completed before the formation of the epitaxial layer 54 (i.e., with the implantation process shown in FIGS. 4 and 5).

Figure 7:
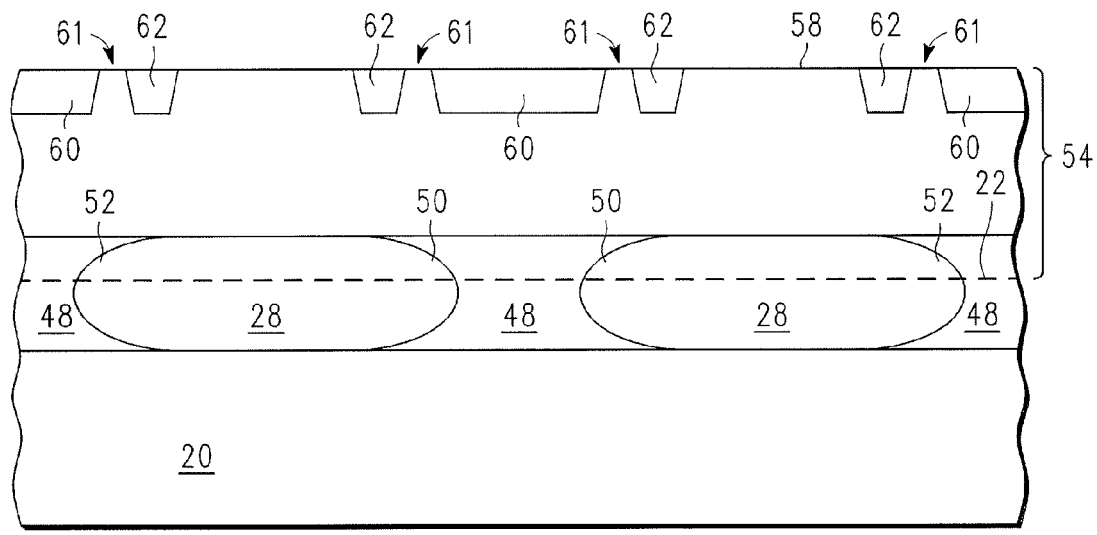
FIG. 7 is a cross-sectional side view of the substrate of FIG. 6 after isolation trenches have been formed in the epitaxial layer according to an embodiment of the present invention.

Next, as shown in FIG. 7, shallow trench isolation (STI) regions (or insulating regions) 60 are then formed on, or in, the upper surface 58 of the epitaxial layer 54. As is commonly understood in the art, the STI regions 60 may be formed by etching trenches into the upper surface 58 of the epitaxial layer 54, covering the entire upper surface 58 with an insulating material, such as a field oxide, and removing the portions of the insulating material not in the trenches. The STI regions 60 may, for example, have a thickness of between 0.3 and 1 μm. As shown, openings (or gaps) 61 are formed in the STI regions 60 to separate ends (or end portions) 62 of the STI regions 60. The openings 61 and/or the end portions 62 may extend over the ends 50 and 52 of the buried layers 28. Widths of the STI regions 60 may be appropriately adjusted depending on the voltage requirements of the semiconductor device, as is commonly understood, and is typically between 0.5 and 5 μm.

Figure 8:
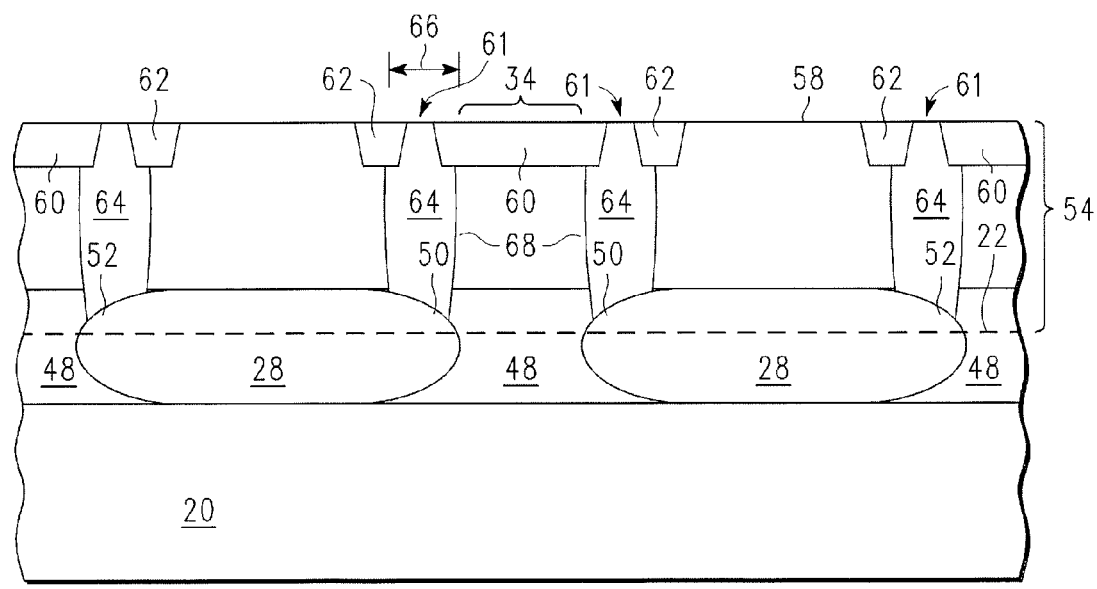
FIG. 8 is a cross-sectional side view of the substrate of FIG. 7 after a first set of wells have been formed in the epitaxial layer according to an embodiment of the present invention.
Figure 11:
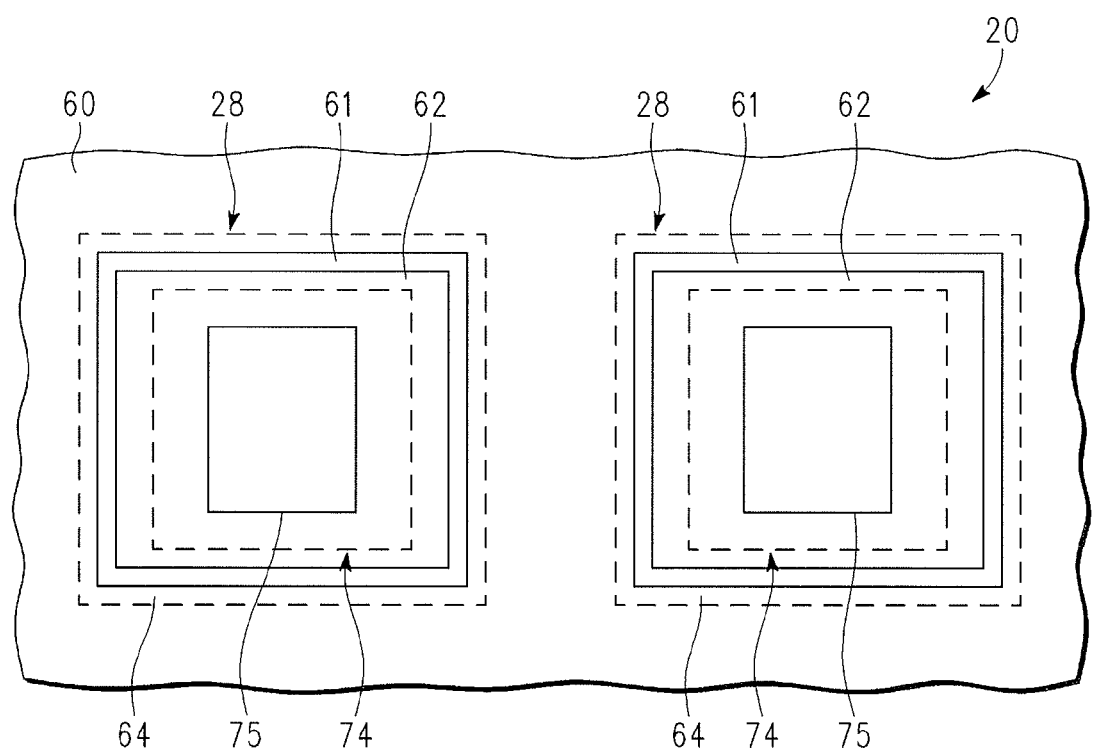
FIG. 11 is a top plan view of the substrate of FIG. 10 taken along line 11-11.

Referring to FIG. 8, first wells (or a first set of wells), or well regions, 64 are then formed within the epitaxial layer 54 below the openings 61 and the end portions 62 of the STI regions 60. The formation of the first wells 64 may be facilitated by the presence of the openings 61. However, as will be appreciated by one skilled in the art, other embodiments may not include the openings 61. In an exemplary embodiment, the wells 64 are formed using ion implantation to have the second conductivity type (i.e., N-type) and may be doped with, for example, phosphorous (P) to a concentration of, for example, approximately $1 \times 10^{18}$ atoms per cm$^3$. The wells 64 interconnect the ends 62 of the STI regions 60 and the respective ends 50 and 52 of the buried layers 28. The wells 64 may have widths 66 of, for example, between 0.5 and 1 μm. As shown, the gap 34 between the first ends 50 of the buried layers 28 extends upwards between pairs of the wells 64 connected to the same STI region 60. In one embodiment, first (or "inner" or adjacent) sides 68 of the wells 64 adjacent to the gap 34 are separated by approximately the same distance as the first ends 50 of the buried layers 28. Referring ahead to FIG. 11, which illustrates the substrate 20 from above, the wells 64 may enclose and form "isolation rings," as is commonly understood, around portions of the epitaxial layer 54. As described below, the isolation rings may be used to electrically isolate and/or provide a breakdown voltage between semiconductor devices. Additionally, the openings 61 in the STI regions 60 may also be in the shape of rings that overlay the isolation rings and may be used to make electrically contact thereto.

Figure 9:
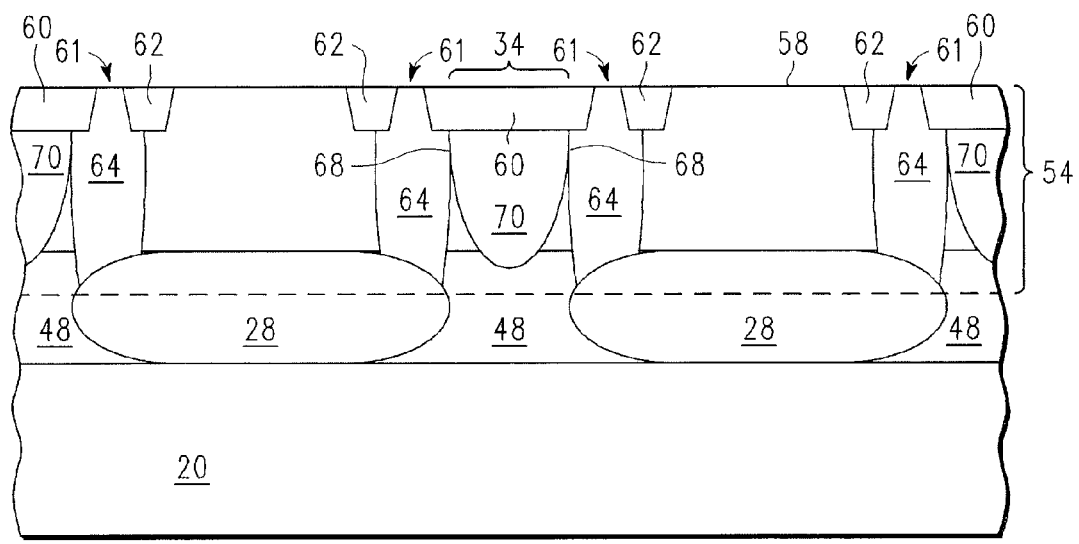
FIG. 9 is a cross-sectional side view of the substrate of FIG. 7 after a second set of wells have been formed in the epitaxial layer according to an embodiment of the present invention.

Next, as illustrated in FIG. 9, second wells 70 (or a second set of wells), which may also be referred to as P-wells or barrier wells, are then formed through the STI regions 60 and in the gaps 34 between and adjacent to the first sides 68 of the wells 64. The P-wells 70 may be formed using ion implantation to have the first conductivity type (i.e., P-type) with ions and concentrations similar to those of the barrier regions 48. That is, in one embodiment, the P-wells 70 are also of the same dopant type as the substrate 20 and the epitaxial layer 54, but at a higher concentration. The P-wells 70 may extend down through the gaps 34 to contact the barrier regions 48. As will be appreciated by one skilled in the art, the wells 64 and the P-wells 70 may be formed with multiple ion implantations processes, each of which implants ions of a particular kinetic energy band to vary the depth of ion penetration. The P-wells 70 may essentially extend the barrier regions 48 up through the gaps 34.

Figure 10:
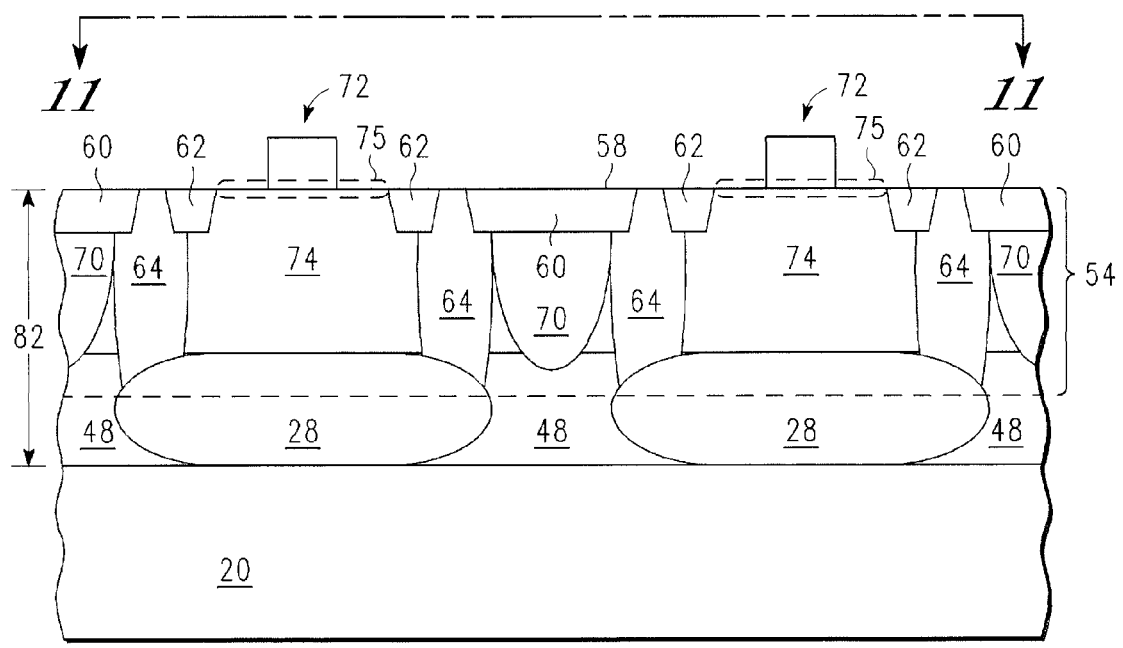
FIG. 10 is a cross-sectional side view of the substrate of FIG. 9 after semiconductor devices have been formed over the epitaxial layer forming a microelectronic assembly according to an embodiment of the present invention.

Referring to FIGS. 10 and 11, semiconductor devices 72 are formed in and/or on the epitaxial layer 54 between the STI regions 60 and above the buried layers 28 in regions, or "islands," 74 of the epitaxial layer 54 that are surrounded by the wells 64. In particular, the devices 72 are formed on the portions of the islands 74 which are not covered by the STI regions 60, which may be referred to as active regions 75. As shown in FIG. 11, the STI regions 60 may cover portions of the substrate 20 on all sides of the active regions 75, as well as the isolation rings (i.e., wells 64 and openings 61). In one embodiment, the semiconductor devices 72 are, for example, transistors (e.g., metal-oxide-semiconductor field-effect transistors (MOSFET) and bi-polar transistors) and although not illustrated in detail may include source regions, drain regions, gate dielectric layers, and gate electrodes, as is commonly understood. The devices 72 may also be other electronic components, such as diodes, resistors, and capacitors. It should be understood that each semiconductor device 72 shown may actually represent multiple devices that form a functional block of circuitry, as is commonly understood, and although shown as being on the upper surface 58 of the epitaxial layer 54 may include components that extend or are formed below the upper surface 58. It should also be understood that although not specifically shown as such in FIG. 11, many of the components, such as the barrier regions 48, may be formed on all sides of the islands 74, in a manner similar to the isolation rings.

Referring again to FIG. 10, of particular interest are the comparative depths occupied by the buried layers 28 and the barrier regions 48. In particular, in the illustrated embodiment, the barrier regions 48 extend a depth 82, as measured from the upper surface 58 of the epitaxial layer 54 or from the semiconductor devices 72, which is greater than or equal to the depth of the buried layers 28.

The formation of the semiconductor devices 72 may substantially complete the formation of an integrated circuit (IC), or microelectronic assembly, as shown in FIGS. 10 and 11. Although not illustrated in detail, the integrated circuit may be a "smart" power IC, as is commonly understood, and may include a power circuit component configured to manage electrical power and at least one additional component configured to control, regulate, monitor, affect, or react to the operation of the power circuit. In practice, the power circuit component may include power transistors, and the at least one additional component may include, without limitation: a sensor (e.g., an environmental condition sensor, an electromagnetic sensor, an electromechanical sensor, an electrical attribute sensor, a transducer, or the like); a power control component; an analog component; a digital logic component; or any combination thereof After final processing steps, which may include the formation of "build-up" layers over the epitaxial layer 54, the substrate 20 may be separated (e.g., sawed) into individual microelectronic dice, or semiconductor chips, packaged, and installed in various electronic or computing systems.

Figure 12:
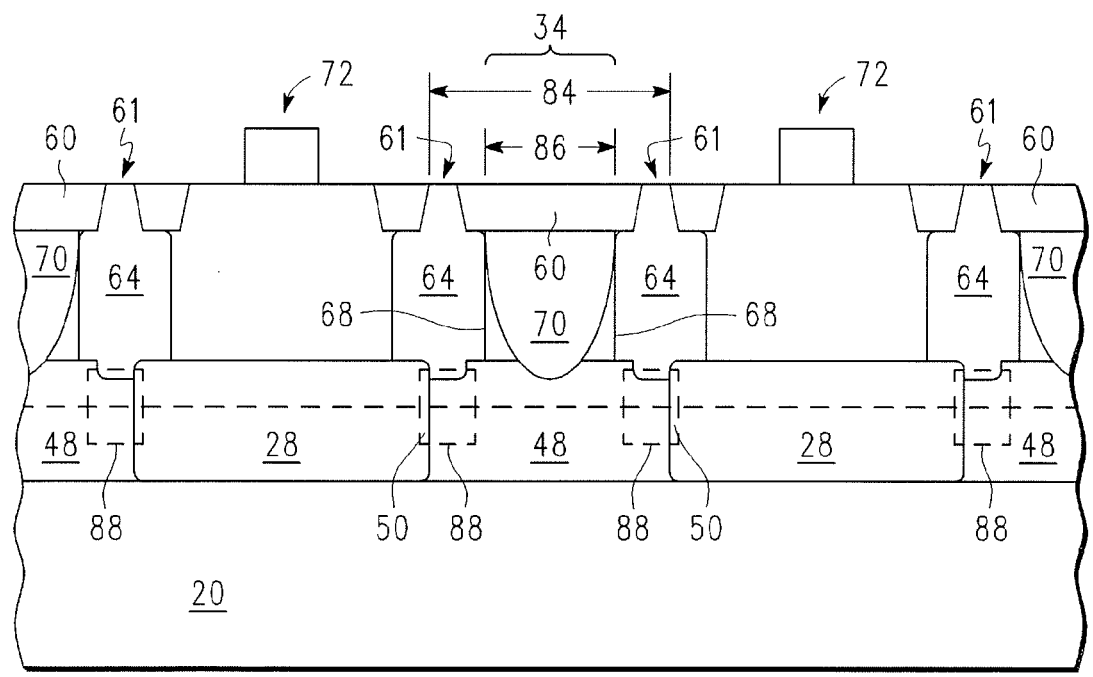
FIG. 12 is a cross-sectional side view of a microelectronic assembly according to another embodiment of the present invention.

One advantage of the microelectronic assembly, and method of forming such, described above is that because the barrier regions, and more specifically, the depth of the barrier regions relative to the buried layers, the voltage handling capability (e.g., "punch-through" voltage) between the individual semiconductor devices is increased. As a result, the operating voltages of the devices may be increased. Alternatively, the distance between individual devices may be decreased while maintaining the same operating voltages. Thus, the overall size of the assembly and the die may be reduced. Another advantage of the method described above is that the oxide layer, and varying thickness thereof, is utilized to form the barrier regions which eliminates the need for an additional processing step (i.e., photo-resist, lithography, etc.). As a result, manufacturing time and costs are minimized FIG. 12 illustrates a microelectronic assembly according to another embodiment of the present invention, which utilizes a "resurf" isolation structure, as is commonly understood. It should be understood that in the embodiment illustrated in FIG. 12, the same reference numerals have been used to identify components which may be similar to the ones shown in FIGS. 1-11. It should also be understood that the shapes of the buried layers 28 and wells 64 may be exaggerated to emphasize the "resurf" nature of the structure shown. Of particular interest in FIG. 12 is the relationship between the first ends 50 of the buried layers 28 and the first sides 68 of the wells 64. As shown, the first sides 68 of the wells 64 extend over the first ends 50 of the buried layers 28. In particular, the gap 34 between the buried layers 28 and the wells 64 has a first width 84 between the first ends 50 of the buried layers 28 and a second width 86 between the first sides 68 of the wells 64. As illustrated, the first width 84 is greater than the second width 86. In one embodiment, for example, the first width 84 is between 2 and 3 µm and the second width 86 is between 1 and 2 µm.

The relationship between the buried layers 28 and the wells 64 creates "resurf junctions" 88 which creates a two-dimensional depletion region between the wells 64, the buried layers 28, and the barrier region and may further increase the breakdown voltage of the isolation rings and the barrier regions, as is commonly understood.

Figure 13:
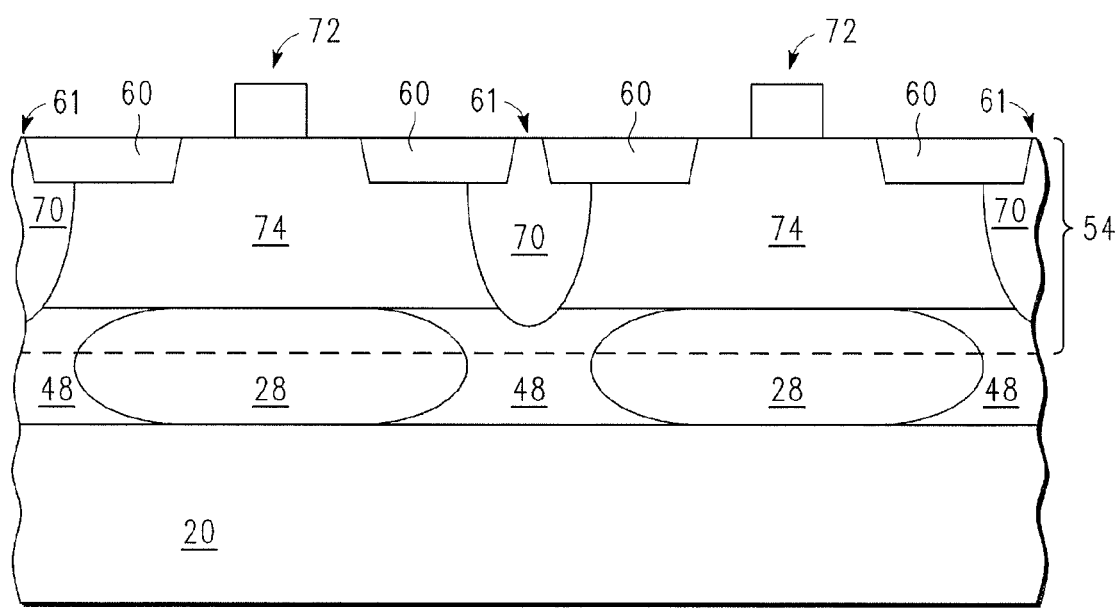
FIG. 13 is a cross-sectional side view of a microelectronic assembly according to a further embodiment of the present invention.

FIG. 13 illustrates a microelectronic assembly according to a further embodiment of the present invention, which utilizes an N-type epitaxial layer 54. It should again be understood that in the embodiment illustrated in FIG. 13, the same reference numerals have been used to identify components which may be similar, or at least correspond, to the ones shown in FIGS. 1-12. Of particular interest in FIG. 13 is that, as indicated above, the epitaxial layer 54 is doped to have the second conductivity type (i.e., N-type) and there is no first set of wells, or well regions 64 (FIGS. 10 and 12). However, the second set of wells, or P-wells 70 (i.e., of the first conductivity type), more particularly, isolation (or barrier) wells in this case, are formed below the STI regions 60 and above the barrier regions 48 to surround islands 74.

Other embodiments may utilize different dopants at different concentrations. Although the description above refers to P-type as being the first dopant and conductivity type and N-type as being the second dopant and conductivity type, it should be understood that the dopant types of the various regions may be switched, as is commonly understood in the art.

Embodiments of the invention provide methods for constructing microelectronic assemblies. First and second semiconductor devices are formed over a substrate having a first dopant type at a first concentration. First and second buried regions having a second dopant type are formed respectively below the first and second semiconductor devices with a gap therebetween. The first and second buried regions each have first ends adjacent to the gap and second ends opposing the gap. The first ends extend a first depth from the first and second semiconductor devices. At least one well region is formed over the substrate and between the first and second semiconductor devices. A barrier region having the first dopant type at a second concentration is formed between and adjacent to the first ends of the first and second buried regions such that at least a portion of the barrier region extends a second depth from the first and second semiconductor devices. The second concentration is greater than the first concentration, and second depth is greater than or equal to the first depth.

The at least one well region may include first and second well regions having the second dopant type respectively above and adjacent to the first and second buried regions and arranged such that the gap between the first and second buried regions further extends between the first and second well regions. A barrier well having the first dopant type at a third concentration may be formed between the first and second well regions. The third concentration may be greater than the first concentration. The first and second well regions may each have a first side adjacent to the gap and a second side opposing the gap.

The gap may have a first width at the first ends of the first and second buried regions and a second width at the first sides of the first and second well regions. The first width may be substantially equal to the second width.

An epitaxial layer may be formed on the substrate. The formation of the first and second buried regions and the barrier region may occur before said formation of the epitaxial layer.

The gap may have a first width at the first ends of the first and second buried regions and a second width at the first sides of the first and second well regions. The first width may be greater than the second width.

Embodiments of the invention also provide methods for constructing microelectronic assemblies. First and second buried layers are formed in a semiconductor substrate having a first dopant type at a first concentration with a gap therebetween. The first and second buried regions have a second dopant type and each have a first end adjacent to the gap and a second end opposing the gap. A barrier region is formed within the gap and adjacent to the first ends of the first and second buried layers. The barrier region has the first dopant type at a second concentration. The second concentration is higher than the first concentration. An epitaxial layer is formed over the semiconductor substrate after the formation of the first and second buried layers and the barrier region. First and second semiconductor devices are formed over the epitaxial layer above the respective first and second buried layers. First and second well regions having the second dopant type are formed within the epitaxial layer respectively above the first ends of the first and second well regions.

The first ends of the first and second buried layers may extend a first depth from the first and second semiconductor devices and at least a portion of the barrier region may extend a second depth from the first and second semiconductor devices. The second depth may be greater than or equal to the first depth. The first and second well regions may be adjacent to the respective first and second buried layers and arranged such that the gap between the first and second buried regions further extends between the first and second well regions.

A barrier well having the first dopant type at a third concentration may be formed between the first and second well regions. The third concentration may be greater than the first concentration. The barrier well may be adjacent to the first and second well regions and the barrier region.

The gap may have a first width at the first ends of the first and second buried layers and a second width at the first sides of the first and second well regions. The first width may be substantially equal to the second width. The gap may have a first width at the first ends of the first and second buried layers and a second width at the first sides of the first and second well regions. The first width may be greater than the second width.

Embodiments of the invention further provide microelectronic assemblies. The microelectronic assembly includes a semiconductor substrate having a first dopant type at a first concentration, first and second buried layers having a second dopant type formed within the semiconductor substrate with a gap therebetween, the first and second buried layers having a first end adjacent to the gap and a second end opposing the gap, a barrier region formed within the gap and adjacent to the first ends of the first and second buried layers, the barrier region having the first dopant type at a second concentration, the second concentration being higher than the first concentration, an epitaxial layer over the semiconductor substrate having the first dopant type at a third concentration, the third concentration being less than the second concentration, first and second semiconductor devices over the epitaxial layer above the respective first and second buried layers, the first ends of the first and second buried layers extending a first depth from the first and second semiconductor devices and at least a portion of the barrier region extending a second depth from the first and second semiconductor devices, the second depth being greater than or equal to the first depth, first and second well regions having the second dopant type within the epitaxial layer respectively above the first ends of the first and second well regions, and an barrier well having the first dopant type at a fourth concentration between the first and second well regions, the fourth concentration being greater than the first concentration.

The barrier well may be adjacent to the first and second well regions and the barrier region, and the first and second well regions may be adjacent to the respective first and second buried layers and arranged such that the gap between the first and second buried regions further extends between the first and second well regions.

The gap may have a first width at the first ends of the first and second buried layers and a second width at the first sides of the first and second well regions. The first width may be substantially equal to the second width. The gap may have a first width at the first ends of the first and second buried layers and a second width at the first sides of the first and second well regions. The first width may be greater than the second width.

The first and second well regions may be annularly shaped and over the second ends of the first and second buried layers. The microelectronic assembly may also include a shallow trench isolation (STI) region between the first and second semiconductor devices and above the first and second well regions and the barrier well.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A microelectronic assembly comprising:
a semiconductor substrate having a first dopant type at a first concentration;
first and second buried layers having a second dopant type formed within the semiconductor substrate with a gap between the first and second buried layers, the first and second buried layers having a first end adjacent to the gap and a second end opposing the gap;
a barrier region formed within the gap and adjacent to the first ends of the first and second buried layers, the barrier region having the first dopant type at a second concentration, the second concentration being higher than the first concentration;
an epitaxial layer over the semiconductor substrate having the first dopant type at a third concentration, the third concentration being less than the second concentration;
first and second semiconductor devices over the epitaxial layer above the respective first and second buried layers, the first ends of the first and second buried layers extending a first depth from the first and second semiconductor devices and at least a portion of the barrier region extending a second depth from the first and second semiconductor devices, the second depth being greater than or equal to the first depth;
first and second well regions having the second dopant type within the epitaxial layer respectively above the first ends of the first and second buried layers; and
a barrier well having the first dopant type at a fourth concentration between the first and second well regions, the fourth concentration being greater than the first concentration.

2. The microelectronic assembly of claim 1, wherein the barrier well is adjacent to the first and second well regions and the barrier region and the first and second well regions are adjacent to the respective first and second buried layers and are arranged such that the gap between the first and second buried layers further extends between the first and second well regions.

3. The microelectronic assembly of claim 2, wherein the gap has a first width at the first ends of the first and second buried layers and a second width at the first sides of the first and second well regions, the first width being substantially equal to the second width.

4. The microelectronic assembly of claim 3, wherein the gap has a first width at the first ends of the first and second buried layers and a second width at the first sides of the first and second well regions, the first width being greater than the second width.

5. The microelectronic assembly of claim 4, wherein the first and second well regions are annularly shaped and are over the second ends of the first and second buried layers.

6. The microelectronic assembly of claim 4, further comprising a shallow trench isolation (STI) region between the first and second semiconductor devices and above the first and second well regions and the barrier well.

7. A microelectronic assembly comprising:
first and second semiconductor devices formed over a substrate having a first dopant type at a first concentration;
first and second buried regions having a second dopant type respectively below the first and second semiconductor devices with a gap between the first and second buried regions, the first and second buried regions each having first ends adjacent to the gap and second ends opposing the gap, the first ends extending a first depth from the first and second semiconductor devices;
an epitaxial layer having the first dopant type over the substrate;
at least one well region over the substrate and between the first and second semiconductor devices; and
a barrier region having the first dopant type at a second concentration between and adjacent to the first ends of the first and second buried regions such that at least a portion of the barrier region extends a second depth from the first and second semiconductor devices, the second concentration being greater than the first concentration and the second depth being greater than or equal to the first depth.

8. The microelectronic assembly of claim 7, wherein the at least one well region comprises first and second well regions having the second dopant type respectively above and adjacent to the first and second buried regions and arranged such that the gap between the first and second buried regions further extends between the first and second well regions.

9. The microelectronic assembly of claim 8, further comprising a barrier well having the first dopant type at a third concentration between the first and second well regions, the third concentration being greater than the first concentration.

10. The microelectronic assembly of claim 8, wherein the first and second well regions each have a first side adjacent to the gap and a second side opposing the gap.

11. The microelectronic assembly of claim 10, wherein the gap has a first width at the first ends of the first and second buried regions and a second width at the first sides of the first and second well regions, the first width being substantially equal to the second width.

12. The microelectronic assembly of claim 10, wherein the gap has a first width at the first ends of the first and second buried regions and a second width at the first sides of the first and second well regions, the first width being greater than the second width.

13. A microelectronic assembly comprising:
first and second buried layers formed in a semiconductor substrate having a first dopant type at a first concentration with a gap between the first and second buried layers, the first and second buried layers having a second dopant type and each having a first end adjacent to the gap and a second end opposing the gap;
a barrier region within the gap and adjacent to the first ends of the first and second buried layers, the barrier region having the first dopant type at a second concentration, the second concentration being higher than the first concentration;
an epitaxial layer having the first dopant type over the semiconductor substrate;
first and second semiconductor devices over the epitaxial layer above the respective first and second buried layers; and
first and second well regions having the second dopant type within the epitaxial layer respectively above the first ends of the first and second buried layers.

14. The microelectronic assembly of claim 13, wherein the first ends of the first and second buried layers extend a first depth from the first and second semiconductor devices and at least a portion of the barrier region extends a second depth from the first and second semiconductor devices, the second depth being greater than or equal to the first depth.

15. The microelectronic assembly of claim 14, wherein the first and second well regions are adjacent to the respective first and second buried layers and are arranged such that the gap between the first and second buried layers further extends between the first and second well regions.

16. The microelectronic assembly of claim 15, further comprising a barrier well having the first dopant type at a third concentration between the first and second well regions, the third concentration being greater than the first concentration.

17. The microelectronic assembly of claim 16, further comprising a shallow trench isolation (STI) region between the first and second semiconductor devices and above the first and second well regions and the barrier well.

18. The microelectronic assembly of claim 13, wherein the gap has a first width at the first ends of the first and second buried layers and a second width at first sides of the first and second well regions, the first width being substantially equal to the second width.

19. The microelectronic assembly of claim 13, wherein the gap has a first width at the first ends of the first and second buried layers and a second width at first sides of the first and second well regions, the first width being greater than the second width.

20. The microelectronic assembly of claim 13, wherein the first and second well regions are annularly shaped and are over the second ends of the first and second buried layers.

* * * * *